(12) United States Patent
Cascone et al.

(10) Patent No.: US 10,069,465 B2
(45) Date of Patent: Sep. 4, 2018

(54) AMPLIFIER CONTROL SYSTEM

(71) Applicant: Communications & Power Industries LLC, Palo Alto, CA (US)

(72) Inventors: Michael J. Cascone, Sunnyvale, CA (US); James D. Russell, Creemore, CA (US); Dagfinn B. Mehus, San Jose, CA (US); Jill T. Zak, Hayward, CA (US); Benjamin A. Munoz, San Mateo, CA (US)

(73) Assignee: Communications & Power Industries LLC, Palo Alto, CA (US)

( * ) Notice: Subject to any disclaimer, the term of this patent is extended or adjusted under 35 U.S.C. 154(b) by 0 days.

(21) Appl. No.: 15/493,080

(22) Filed: Apr. 20, 2017

(65) Prior Publication Data

US 2017/0310283 A1 Oct. 26, 2017

Related U.S. Application Data

(60) Provisional application No. 62/325,951, filed on Apr. 21, 2016.

(51) Int. Cl.
| | |
|---|---|
| *H03F 1/07* | (2006.01) |
| *H03F 1/30* | (2006.01) |
| *H03F 3/193* | (2006.01) |
| *H03F 3/24* | (2006.01) |
| *H03F 1/02* | (2006.01) |
| *H04B 1/04* | (2006.01) |

(52) U.S. Cl.
CPC ............ *H03F 1/301* (2013.01); *H03F 1/0216* (2013.01); *H03F 3/193* (2013.01); *H03F 3/245* (2013.01); *H03F 2200/15* (2013.01); *H03F 2200/451* (2013.01); *H03F 2200/468* (2013.01); *H04B 2001/0408* (2013.01)

(58) Field of Classification Search
CPC .................................................... H03F 1/07
USPC ........................................ 330/51, 124 R, 295
See application file for complete search history.

(56) References Cited

U.S. PATENT DOCUMENTS

| | | | |
|---|---|---|---|
| 5,781,066 A * | 7/1998 | Parisi | H03F 1/526 330/124 D |
| 5,986,500 A * | 11/1999 | Park | H03F 1/3235 330/124 D |
| 6,359,515 B1 | 3/2002 | Buer | |
| 6,362,689 B1 | 3/2002 | Buer | |
| 6,388,528 B1 | 5/2002 | Buer et al. | |
| 6,542,035 B2 | 4/2003 | Cook et al. | |
| 6,664,855 B2 | 12/2003 | Buer et al. | |
| 6,967,651 B2 | 11/2005 | Endoh et al. | |
| 7,180,367 B2 | 2/2007 | Woods et al. | |
| 7,397,400 B2 | 7/2008 | Miller | |
| 7,489,022 B2 | 2/2009 | Torkington et al. | |
| 7,532,073 B2 | 5/2009 | Lopez | |
| 7,535,320 B2 | 5/2009 | Buer et al. | |
| 7,839,237 B2 | 11/2010 | Buer et al. | |
| 7,843,282 B2 | 11/2010 | Buer et al. | |
| 7,894,510 B2 | 2/2011 | Miller et al. | |
| 7,911,948 B2 | 3/2011 | Sebastian | |
| 7,932,781 B2 | 4/2011 | Lopez | |

(Continued)

*Primary Examiner* — Henry Choe
(74) *Attorney, Agent, or Firm* — CanaanLaw, P.C.; David B. Ritchie (57) ABSTRACT

A method, system and apparatus provide operation of an RF amplifier at a power level responsive to detected or expected conditions such as weather attenuation.

18 Claims, 7 Drawing Sheets

(56) References Cited

U.S. PATENT DOCUMENTS

| | | | |
|---|---|---|---|
| 8,010,055 B2 | 8/2011 | Buer | |
| 8,010,705 B1 | 8/2011 | Sebastian et al. | |
| 8,035,203 B2 | 10/2011 | Torkington et al. | |
| 8,044,845 B2 | 10/2011 | Saunders | |
| 8,072,065 B2 | 12/2011 | Lopez et al. | |
| 8,072,873 B2 | 12/2011 | Thesling | |
| 8,077,652 B2 | 12/2011 | Thesling | |
| 8,160,507 B2 | 4/2012 | Lorg et al. | |
| 8,212,631 B2 | 7/2012 | Lopez et al. | |
| 8,254,851 B2 | 8/2012 | Laidig et al. | |
| 8,384,498 B2 | 2/2013 | Grondahl et al. | |
| 8,385,855 B2 | 2/2013 | Lorg et al. | |
| 8,396,428 B2 | 3/2013 | Buer et al. | |
| 8,396,496 B2 | 3/2013 | Buer et al. | |
| 8,401,512 B2 | 3/2013 | Buer | |
| 8,433,257 B2 | 4/2013 | Laidig et al. | |
| 8,436,450 B2 | 5/2013 | Menon | |
| 8,489,018 B2 | 7/2013 | Irvine et al. | |
| 8,493,877 B1 | 7/2013 | Das et al. | |
| 8,516,069 B1 | 8/2013 | Sebastian | |
| 8,520,564 B1 | 8/2013 | Lorg et al. | |
| 8,520,722 B2 | 8/2013 | Buer et al. | |
| 8,542,081 B2 | 9/2013 | Parekh et al. | |
| 8,547,863 B2 | 10/2013 | Miller et al. | |
| 8,559,905 B2 | 10/2013 | Buer et al. | |
| 8,598,966 B2 | 12/2013 | Lopez et al. | |
| 8,599,085 B2 | 12/2013 | Buer et al. | |
| 8,671,223 B1 | 3/2014 | Sebastian et al. | |
| 8,730,119 B2 | 5/2014 | Runyon et al. | |
| 8,836,430 B1* | 9/2014 | Robison | H03F 3/607 |
| | | | 330/286 |
| 8,872,333 B2 | 10/2014 | Lopez et al. | |
| 8,907,745 B2 | 12/2014 | Grondahl et al. | |
| 8,957,722 B2 | 2/2015 | Zienkewicz et al. | |
| 8,981,886 B2 | 3/2015 | Tor et al. | |
| 8,988,294 B2 | 3/2015 | Voss et al. | |
| 8,988,300 B2 | 3/2015 | Runyon et al. | |
| 9,035,728 B2 | 5/2015 | Zienkewicz et al. | |
| 9,065,162 B2 | 6/2015 | Runyon et al. | |
| 9,136,809 B2* | 9/2015 | McMorrow | H03F 1/0261 |
| 9,184,482 B2 | 11/2015 | Runyon et al. | |
| 9,462,358 B2* | 10/2016 | Caviglia | H04J 14/0294 |
| 2008/0057883 A1* | 3/2008 | Pan | H03F 1/0277 |
| | | | 455/127.1 |
| 2009/0289710 A1* | 11/2009 | Hardy | G01S 1/024 |
| | | | 330/251 |
| 2010/0045383 A1* | 2/2010 | Maruyama | H03F 3/45183 |
| | | | 330/278 |
| 2010/0054325 A1* | 3/2010 | Sjostrom | H03F 3/217 |
| | | | 375/238 |
| 2011/0102052 A1* | 5/2011 | Billingsley | H01H 9/542 |
| | | | 327/365 |
| 2012/0146731 A1* | 6/2012 | Khesbak | H03F 1/0222 |
| | | | 330/295 |
| 2012/0161863 A1* | 6/2012 | Hardy | G01S 1/024 |
| | | | 327/560 |
| 2014/0152390 A1* | 6/2014 | McMorrow | H03F 1/0261 |
| | | | 330/295 |
| 2014/0225666 A1* | 8/2014 | Kusu | H03F 1/0277 |
| | | | 330/124 D |
| 2014/0247092 A1* | 9/2014 | Robison | H03F 3/607 |
| | | | 330/296 |

* cited by examiner

AMPLIFIER CONTROL SYSTEM

STATEMENT OF RELATED APPLICATION(S)

The present application claims the benefit of priority based on U.S. Provisional Patent Application Ser. No. 62/325,951, filed on Apr. 21, 2016, in the name of inventors Michael J. Cascone and James D. Russsell, entitled "Amplifier Control System", all commonly owned herewith and the contents of which are hereby incorporated by reference as if set forth fully herein.

TECHNICAL FIELD

The present disclosure relates generally to a system and method for controlling the output power of an RF amplifier in response to detected or expected external conditions.

BACKGROUND

In the satellite communications service, solid state amplifiers (particularly Gallium Nitride-, or GaN-based amplifiers) are more and more frequently being deployed to provide the uplink signal from the ground uplink station to the satellite. The condition of the atmosphere between the ground uplink station antenna and the satellite can add up to about 20 db of path loss (e.g., in rainy conditions) over optimal (e.g., clear) conditions (in, e.g., the Ka microwave band (26.5-40.0 GHz). Rather than run maximum power at all times it would be desirable from equipment longevity and power consumption points of view to reduce output power to the minimum amount practical to achieve the desired communications.

OVERVIEW

The subject matter described herein generally relates to apparatus, systems, methods and associated computer instructions for operating an RF amplifier for improved energy efficiency in response to detected or expected external conditions.

The foregoing overview is a summary and thus may contain simplifications, generalizations, and omissions of detail; consequently, those skilled in the art will appreciate that the overview is illustrative only and is not intended to be in any way limiting.

BRIEF DESCRIPTION OF THE DRAWINGS

The accompanying drawings, which are incorporated into and constitute a part of this specification, illustrate one or more exemplary embodiments and, together with the description of the exemplary embodiments, serve to explain the principles and implementations of the invention.

In the drawings.

DESCRIPTION OF EXAMPLE EMBODIMENTS

Exemplary embodiments are described herein in the context of an amplifier control system. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the exemplary embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

References herein to "one embodiment" or "an embodiment" or "one implementation" or "an implementation" means that a particular feature, structure, part, function or characteristic described in connection with an exemplary embodiment can be included in at least one exemplary embodiment. The appearances of phrases such as "in one embodiment" or "in one implementation" in different places within this specification are not necessarily all referring to the same embodiment or implementation, nor are separate and alternative embodiments necessarily mutually exclusive of other embodiments.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
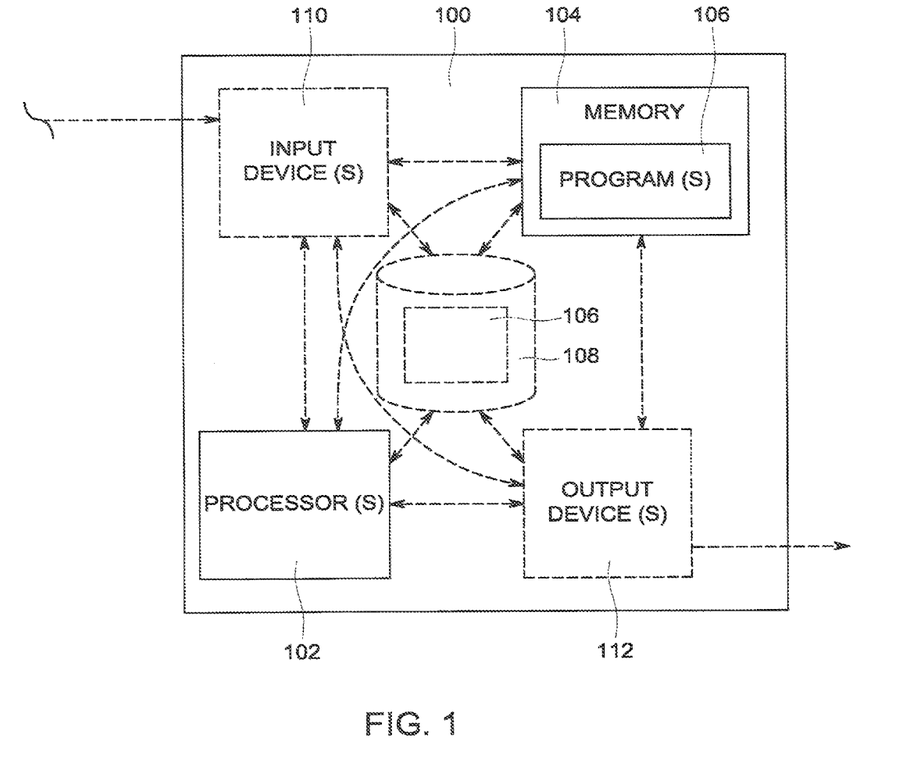
FIG. 1 is a system block diagram illustrating a computer system configured for implementing at least one of a method, a system and software in accordance with exemplary embodiments.

FIG. 1 is a system block diagram illustrating a computer system configured for implementing at least one of a method, a system and software in accordance with exemplary embodiments. FIG. 1 depicts a device or a computer system 100 comprising one or more processors 102 and a memory 104 storing one or more programs 106 for execution by the one or more processors 102.

In some embodiments, the device or computer system 100 can further comprise a non-transitory computer-readable storage medium 108 storing the one or more programs 106 for execution by the one or more processors 102 of the device or computer system 100.

In some embodiments, the device or computer system 100 can further comprise one or more input devices 110, which can be configured to send or receive information to or from any one or more of: an external device (not shown), a website (not shown), the one or more processors 102, the memory 104, the non-transitory computer-readable storage medium 108, and one or more output devices 112.

In some embodiments, the device or computer system 100 can further comprise one or more output devices 112, which can be configured to send or receive information to or from any one from the group consisting of: an external device (not shown in FIG. 1), the one or more processors 102, the memory 104, and the non-transitory computer-readable storage medium 108.

Each of the above identified steps, modules or programs corresponds to a set of instructions for performing a function described above. These modules and programs (i.e., sets of instructions) need not be implemented as separate software programs, procedures or modules, and thus various subsets of these modules may be combined or otherwise re-arranged in various embodiments. In some embodiments, memory may store a subset of the modules and data structures identified above. Furthermore, memory may store additional modules and data structures not described above.

The illustrated aspects of the disclosure may also be practiced in distributed computing environments where certain tasks are performed by remote processing devices that are linked through a data communications network. In a distributed computing environment, program modules can be located in both local and remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more integrated circuit (IC) chips. For example, in one embodiment, a set of components can be implemented in a single IC chip. In other embodiments, one or more of respective components are fabricated or implemented on separate IC chips.

What is described here includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned systems, circuits and modules are described herein with respect to interaction between several components or blocks. It can be appreciated that such systems, circuits and modules circuits and components or blocks can include those components or specified subcomponents, some of the specified components or sub-components, and/or additional components, and according to various permutations and combinations of the foregoing. Subcomponents can also be implemented as components communicatively coupled to other components rather than included within parent components. Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Computing devices typically include a variety of media, which can include tangible computer-readable storage media and/or communications media, in which these two terms are used herein differently from one another as follows. Tangible computer-readable storage media can be any available storage media that can be accessed by the computer, is typically of a non-transitory nature, and can include both volatile and nonvolatile media, removable and non-removable media. By way of example, and not limitation, tangible computer-readable storage media can be implemented in connection with any method or technology for storage of information such as computer-readable instructions, program modules, structured data, or unstructured data. Tangible computer-readable storage media can include, but are not limited to, RAM (random access memory), ROM (read-only memory), PROM (programmable read-only memory), EEPROM (electrically eraseable programmable read-only memory), flash memory, jump drives, USB (universal serial bus) drives (and the like) or other memory technology, compact disk (CD and CD-ROM), digital versatile disk (DVD and DVD-ROM), paper card, paper tape or other information storage media, magnetic cassettes, magnetic tape, magnetic disk storage or other magnetic storage devices, or other tangible and/or non-transitory media which can be used to store desired information. Tangible computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal that can be transitory such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

In view of the exemplary systems described above, methodologies that may be implemented in accordance with the described subject matter will be better appreciated with reference to the flowcharts of the various figures. For simplicity of explanation, the methodologies are depicted and described as a series of acts. However, acts in accordance with this disclosure can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be appreciated that the methodologies disclosed in this specification are capable of being stored on an article of manufacture to facilitate transporting and transferring such methodologies to computing devices. The term article of manufacture, as used herein, is intended to encompass a computer program accessible from any computer-readable device or storage media.

Figure 2:
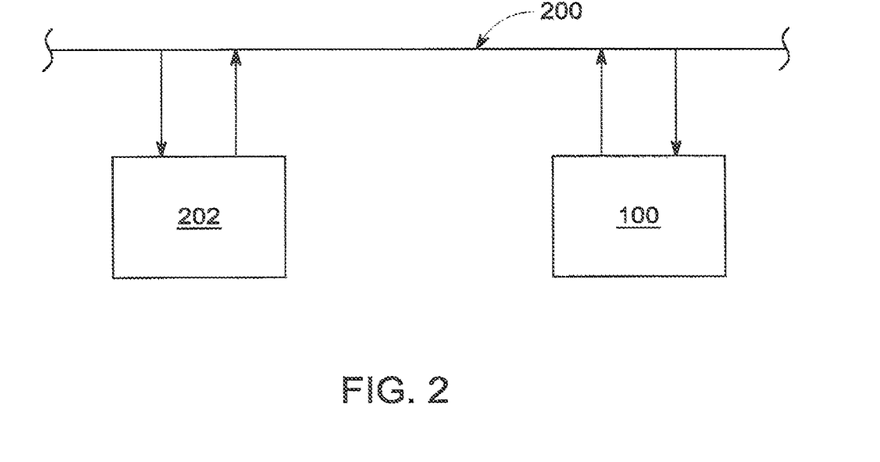
FIG. 2 is a system block diagram illustrating a portion of a data communications network coupling a user's computer device to a server device.

FIG. 2 is a system block diagram illustrating a portion of a data communications network coupling a computer system to a user's computer. This is a typical scenario wherein a computer system 100 such as a web server provides computer functionality to a user's computer 202 over a data communications network 200 such as a local area network (LAN) or the Internet. The user's computer 202 may be coupled via wires and/or wirelessly to the data communications network 200 so that the user may access the computer system 100. The user's computer 202 may also be used via a computer network such as a Local Area Network (LAN) or the Internet to access websites in conjunction with the function of the satellite communication system 300 described in more detail below.

Figure 3:
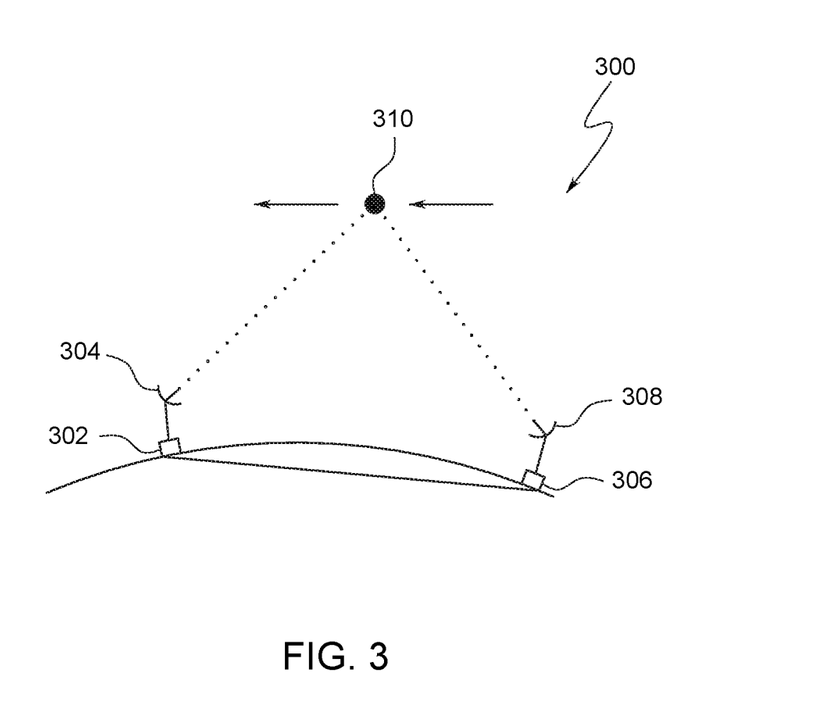
FIG. 3 is a schematic diagram of a basic satellite communications system.

Turning now to FIG. 3 a basic satellite communications system 300 is illustrated schematically. Such systems include a first uplink ground station 302 having signal generation and amplification equipment and an uplink antenna 304. They also include downlink stations 306 having receiving and decoding equipment and a downlink antenna 308. Such systems may be configured for one-way communications as in broadcast satellite television systems or for two-way communications as in the case of satellite internet gateways. A satellite 310 in orbit receives the uplink signal from uplink station 302 and transponds it back to downlink station 306.

A common problem encountered with satellite communications systems is that weather conditions such as rain can cause significant signal attenuation from time to time with respect to nominal conditions. This forces the operators of such systems to design and operate them under worst case conditions at all times so that they will not suffer signal interruption in response to weather conditions. This results in higher power being expended than needed most of the time and, due to the higher temperatures resulting from higher power operation, shorter equipment life. It would be more desirable to operate the equipment at a power output level appropriate to the conditions at hand.

In one embodiment, the present invention may be deployed in the 26.5-40 GHz Ka microwave frequency band. In that band, typical "rain fade" can be around 20 db. In another embodiment, the present invention may be deployed in the 12-18 GHz Ku Band. In that band, typical "rain fade" can be around 10 db. The invention may be deployed in any frequency band where the attenuation compensation feature would be useful.

There are a number of ways to implement the present invention. One way is to utilize a beacon signal transmitted by the satellite having a known signal level and measure the signal level received. From this measurement, the path attenuation between the satellite and the ground uplink station can be readily determined at any point in time and utilized to determine the output power level required of the ground station uplink amplifier. Another way is to obtain weather data local to the ground uplink station and use that data to calculate an expected path attenuation—such data is readily available from, e.g., the U.S. National Weather Service (NWS) at, e.g., the URL http://forecast.weather.gov, the U.S. National Oceanographic and Atmospheric Agency (NOAA), at, e.g., the URL http://www.noaa.gov, and similar governmental and private web sites on the Internet. Yet another way is to implement local sensors at or near the ground uplink station to directly observe the weather conditions to determine a likely attenuation factor.

Figure 4:
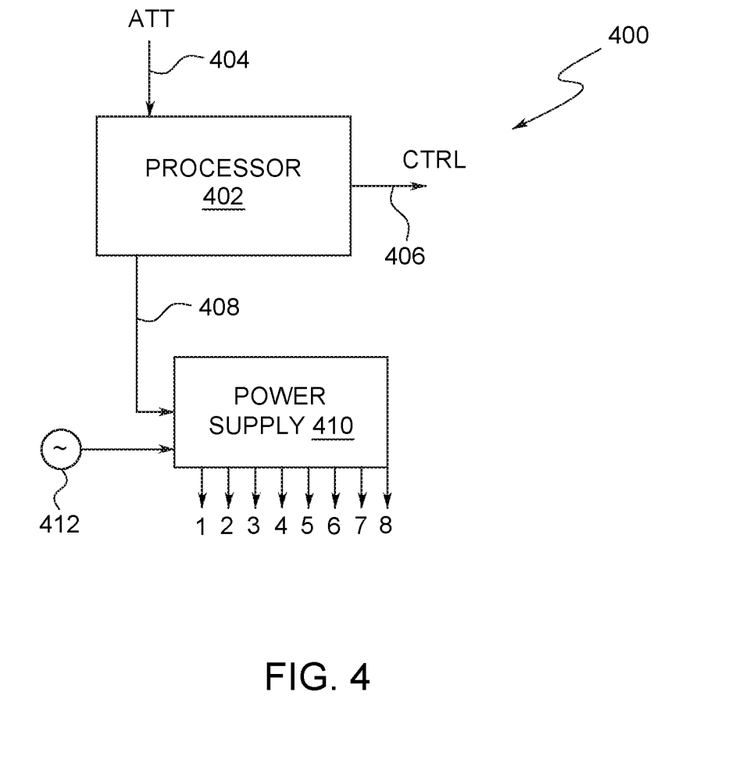
FIG. 4. is a schematic block diagram showing a portion of a satellite communications system in accordance with an embodiment.

FIG. 4. is a schematic block diagram showing a portion 400 of a satellite communications system in accordance with an embodiment. Once the attenuation factor is known it is applied to a processor 402 at input 404 and the processor is used to determine control signals on line(s) 406 and/or 408 for controlling the uplink amplifier circuitry to achieve an appropriate power output level. A power supply 410 provides electrical power to the final output elements of the uplink amplifier and is normally itself powered by an AC power source 412.

Figure 5:
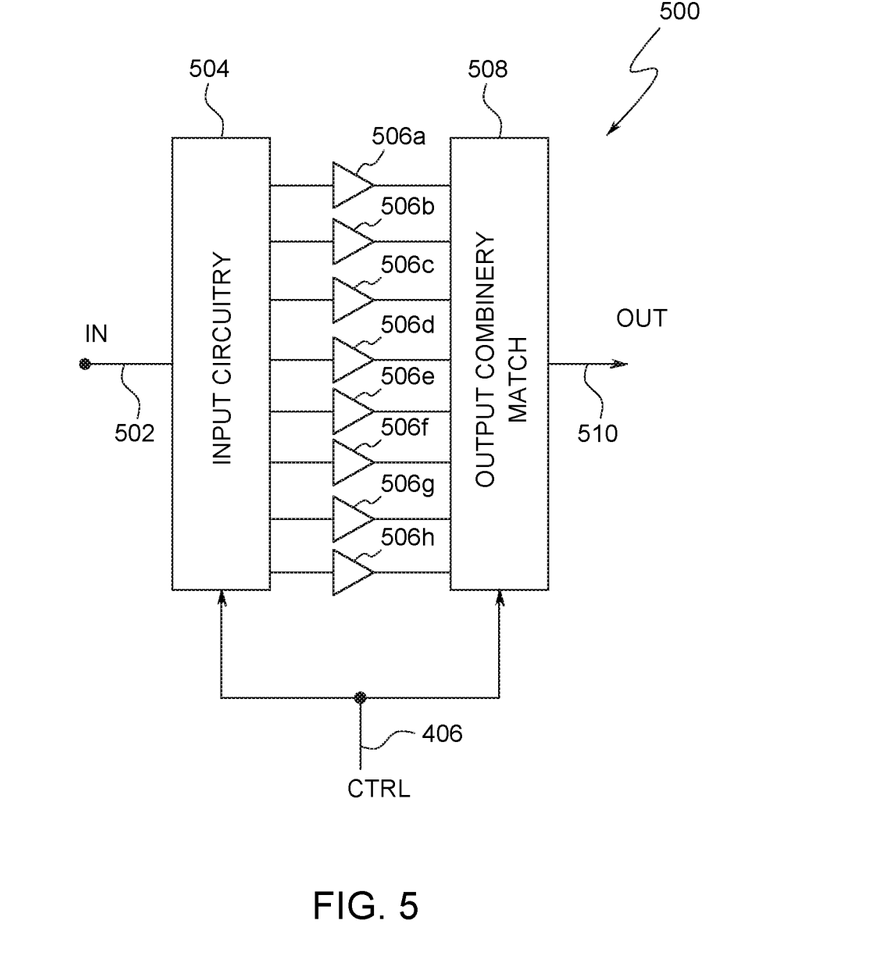
FIG. 5 is. is a schematic block diagram showing a portion of a satellite communications system comprising the final power amplifier section in accordance with an embodiment.

FIG. 5 is a schematic block diagram showing a portion 500 of a satellite communications system comprising the final power amplifier section in accordance with an embodiment. In accordance with FIG. 5 an input signal, e.g., from an exciter (not shown), on line 502 is delivered to final amplifier input circuitry block 504. Block 504 is responsible for dividing the signal among the active amplification elements 506a, 506b, 506c, 506d, 506e, 506f, 506g, 506h, some or all of which may be in use at any given moment. Block 504 handles impedance matching and switching tasks. The impedance matching will be different depending upon the number of active amplification elements in use. Output combiner and impedance matcher block 508 combines the outputs of active amplification elements 506a-506h and matches their impedance to the output impedance of the amplifier on output line 510 which is ultimately routed to the uplink antenna (not shown in FIG. 5). The control signal on line 406 is directed to block 504 and block 508 to instruct them as to which active amplification elements are to be used at a given time and to configure them for appropriate impedance matching.

The result is that in a low attenuation configuration not all of the active amplification elements 506a-506h will be in use and in a high attenuation configuration most or all of the active amplification elements 506a-506h will be in use. It will now be appreciated by those of ordinary skill in the art that using this approach, in addition to the attenuation compensation feature discussed above, spare active amplification elements may be provided for automatic deployment in case of the failure of one or more active amplification elements.

Figure 6A:
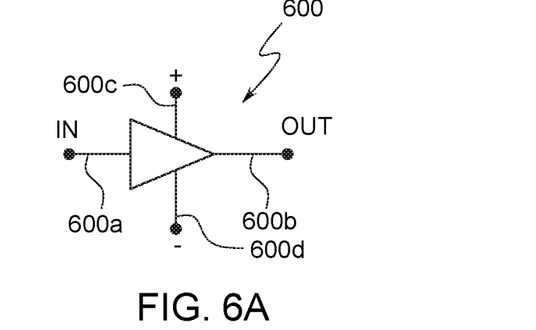
FIG. 6A is a schematic diagram of a conventional solid state final output amplifier amplification component.
Figure 6B:
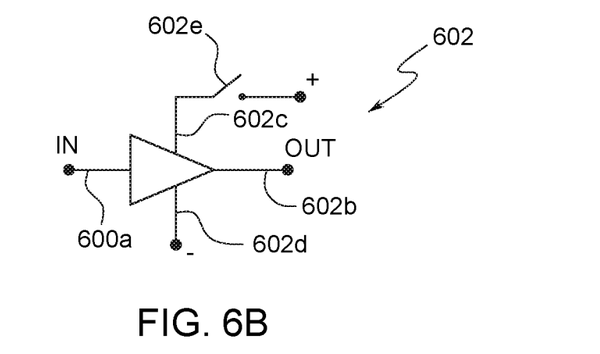
FIG. 6B is a schematic diagram of a solid state final output amplifier amplification component in accordance with one embodiment.
Figure 6C:
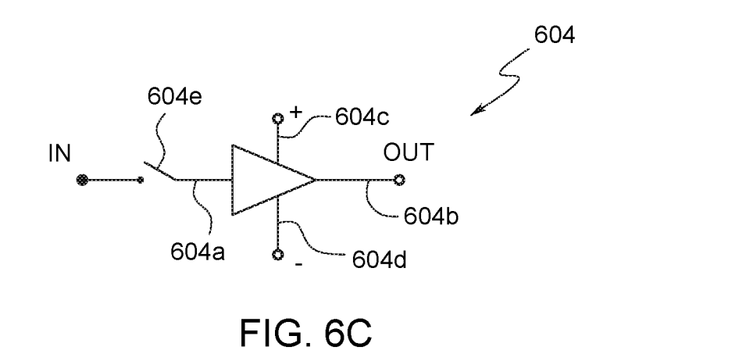
FIG. 6C is a schematic diagram of a solid state final output amplifier amplification component in accordance with another embodiment.
Figure 6D:
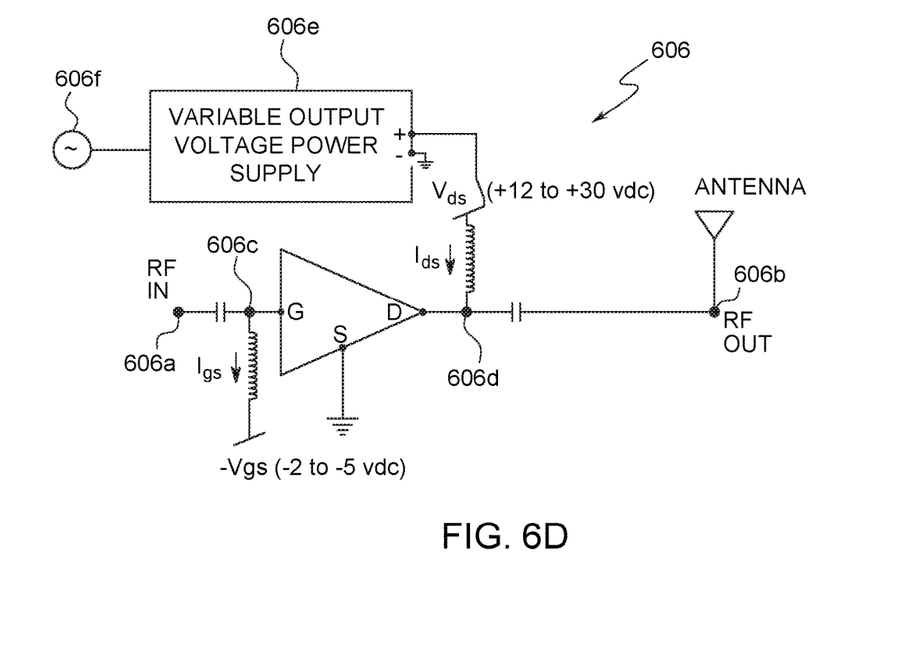
FIG. 6D is a schematic diagram of a solid state final output amplifier amplification component in accordance with another embodiment.

FIG. 6A is a schematic diagram of a conventional solid state final output amplifier active amplification component 600. FIG. 6B is a schematic diagram of a solid state final output amplifier active amplification component 602 in accordance with one embodiment. FIG. 6C is a schematic diagram of a solid state final output amplifier active amplification component 604 in accordance with another embodiment. FIG. 6D is a schematic diagram of a solid state final output amplifier active amplification component 606 in accordance with another embodiment. Component 600 has an RF input 600a, an RF output 600b and a power supply connection 600c/600d. One approach to controlling the active amplification elements is illustrated at FIG. 6B.

Active amplification element 602 at FIG. 6B also has an RF input 602a, an RF output 602b and a power supply connection 602c/602d. However, a control switch 602e is disposed in the path of the power provided to the active amplification element. Interruption of the control switch 602e will turn off the corresponding active amplification element. Active amplification element 604 at FIG. 6C also has an RF input 604a, an RF output 604b and a power supply connection 604c/604d. However, a control switch 604e is disposed in the path of the RF input signal applied to input 604a. Interruption of the control switch 604e will turn off the input to the corresponding active amplification element causing it to have no signal to amplify and to use little or no power.

Various power output levels can be provided depending upon the design considerations. For example, in an 8-device amplifier, 2, 4 or 8 devices could be turned on corresponding to a 6 db, 3 db or 0 db attenuation with respect to full output power with all 8 devices in use. Those of ordinary skill in the art will now appreciate that many different configurations may be implemented depending upon the system requirements of a particular system. Also, it should be noted that rather than simply turning off the amplification devices the bias voltage Vds and/or current Ids may be adjusted to achieve the desired power reduction result.

In accordance with an implementation of this embodiment the output of the final high power amplifier(s) are adjusted by varying the drain-source bias voltage Vds applied to the final amplification elements. These can be adjusted individually if more than one is present, or, they may be ganged together so that a plurality of amplification devices may be controlled simultaneously where a plurality are present.

Turning to FIG. 6D, an amplification element 606 has an input node at 606a, an output node at 606b, a gate bias node at 606c for connection to a gate bias supply (Vgs), and a drain bias node at 606d for connection to a drain bias supply (Vds). An AC input signal to be amplified is applied to input node 606a and capacitively coupled to the amplification circuit. At node 606a a bias voltage Vds is applied from a power supply such as variable voltage power supply 606e itself powered by connection to, for example, a mains supply 606f In one embodiment Vds is variable between about 12.6 Vdc and about 30 Vdc. In another embodiment (as illustrated below in Table I) Vds is variable between about 14 Vdc and 26 Vdc. The voltage range will depend upon the specifications of the actual devices used in the implementation as well as various common design criteria used by the amplifier designer.

In the embodiment illustrated in FIG. 6D, the active final high power amplification elements are GaN (Gallium Nitride) FET (Field Effect Transistor) devices although the invention is applicable to other types of solid state devices and other frequency bands. For example, the approach will work with conventional FETs, MOSFETs, LD MOSFETs, GaAs FETs, Power MOSFETs, IGBTs (Insulated Gate Bipolar Transistors), and other types of solid state RF power amplification devices which are amenable to combination. GaN has, however, shown to be a preferred choice over GaAs, due to the undesirable oscillatory nature of GaAs FETs when operating with a changing supply voltage. GaN is also preferred over Silicon due to the parasitic capacitance of the body diode, which is absent in the GaN FET. The GaN device is not susceptible to the avalanche effect due to the lack of this body diode (hence no lossy high capacitance). This does not mean that the GaN device is perfect. It is still susceptible to the Miller effect (i.e., the input impedance of the amplification stage will increase due to amplification of the effect of impedance between the input and output nodes).

The Vth (threshold voltage) of a GaN HEMT (high electron mobility transistor) is higher than Silicon MOSFETs, which means it will have a higher dv/dt. The GaN HEMT could turn on (when it's supposed to be off) during a high rate of change at the drain terminal. This unwanted transient current can lead to excessive power dissipation and/or device failure thus it is desirable to limit the rate of change of Vds (drain-source voltage) so as to avoid this effect. GaN devices will enjoy a longer operational life (MTBF) and use less power if operated at a lower drain voltage. Too low, and it won't be able to provide the desired output power. This "Dynamic Power Consumption Control": (DPCC) technique (variable bias) will place the drain voltage (Vds) of the GaN FET device at a relatively optimal setting providing the output power needed for the operational (detected) conditions. In one embodiment, all FETs in the final output stage will be set to the same drain voltage, Vds. In the unmodified amplifier, all of the GaN FETs were configured to operate at a fixed drain voltage, Vds, of 26 Vdc. Less voltage than 26 Vdc will operate the GaN FETs while providing less power output (and less power consumption). The lowest voltage for stable power output was determined to be 14 Vdc.

Making a change to Vds requires re-biasing of the Ids (drain-source current) quiescent point (Idsq) to the appropriate value for each setting of Vds. This may be accomplished in a couple of ways. First, a recalibration routine may be performed to vary the Vgs (gate-source bias voltage) to maintain the Idsq at the appropriate point for each setting of Vds, determine the appropriate Vgs for each Vds and store that value in a memory such as a look-up table for use by a controller in running the amplifier. Second, an active auto-recalibration routine may be performed periodically by a controller to set Vgs to an appropriate value on the fly as conditions (such as Vds) change over time. In one embodiment, the Vgs may vary from about −2 Vdc to about −5 Vdc as illustrated in FIG. 6D.

This technology has been developed to be employed on SSPAs (Solid State Power Amplifiers). It cannot be considered for TWT (Travelling Wave Tube) RF amplifiers (as typically used on satellites and other spacecraft) due to the TWT's need for a stable supply voltage.

Furthermore, the invention is not limited to use in the satellite communication service and can be used for terrestrial and other communication systems which are also subject to periodic attenuation from any cause.

This approach results in reduced energy consumption, reduced emitted power, lowered amplifier temperature for potentially increased reliability and device longevity and can be achieved through a software/firmware command or automatically with a weather monitoring application.

It is also possible to lower the power output in response to a detected fault condition (rather than detected or expected signal attenuation), such as high equipment or ambient temperature, high SWR (Standing Wave Ratio) or the like in order to maintain a signal without causing damage to the associated equipment.

Table I set forth below illustrates some sample data taken from an amplifier built in accordance with the principles described herein. In this example, the nominal (maximum) drain voltage (Vds) of the GaN FETs is 26 VDC and the minimum voltage at which they will operate is 14 VDC. The columns are RF Input in dBm to the amplifier, Vds (measured in Volts DC), Ids (drain-source current for the GaN FETs in A), RF Output in dBm from the amplifier, and the difference between the maximum drain voltage and Vds (measured) (26-Vd) in Volts DC. The amplifier used is a modified commercially available CPI Model B5KO Ka-Band 160 W SuperLinear GaN SSPA/BUC satellite uplink amplifier available from CPI in Palo Alto, Calif. The modification allows the drain voltage Vds to be modified during operation of the SSPA. In this experiment Vds was simultaneously changed for all GaN FETS in the amplifier and Id represents the total combined current through the drains of all combined GaN FETs.

TABLE I

| RF Input (dBm) | Vds (Vdc) | Ids (A) | RF Output (dBm) | 26-Vds |
| --- | --- | --- | --- | --- |
| −60 | 14.0 | 5.15 | 00.00 | 12.0 |
| −20 | 14.7 | 7.24 | 36.16 | 11.3 |
| −19 | 14.95 | 7.83 | 37.50 | 11.05 |
| −18 | 15.3 | 8.60 | 38.70 | 10.7 |
| −17 | 15.8 | 9.70 | 40.00 | 10.2 |
| −16 | 16.6 | 10.99 | 41.80 | 9.4 |
| −15 | 17.9 | 12.07 | 43.50 | 8.1 |
| −14 | 19.7 | 15.38 | 45.20 | 6.3 |
| −13 | 22.0 | 17.90 | 46.74 | 4.0 |
| −12 | 24.0 | 20.07 | 47.80 | 2.0 |
| −11.64 | 24.8 | 20.72 | 48.00 | 1.2 |
| −11.48 | 25.0 | 21.19 | 48.13 | 1.0 |

While exemplary embodiments and applications have been shown and described, it would be apparent to those skilled in the art having the benefit of this disclosure that numerous modifications, variations and adaptations not specifically mentioned above may be made to the various exemplary embodiments described herein without departing from the scope of the invention which is defined by the appended claims.

What is claimed is:

1. A method for operating a solid-state RF power amplifier (SSPA) at a satellite ground station, the SSPA having an input for receiving an input signal, an output for providing an output signal, and a plurality of active amplification elements, the method comprising:
   determining a number of the plurality of active amplification elements to be used;
   routing the input signal to the determined number of the plurality of active amplification elements; and
   combining individual output signals from the determined number of the plurality of active amplification elements to provide the output signal,
   wherein the determining includes:
   receiving at the ground station a transmitted beacon signal having a predetermined transmitted signal level from a satellite;
   measuring at the ground station a signal level of the received beacon signal; and
   periodically calculating a difference between the predetermined transmitted signal level and the measured signal level, and based upon the calculation determining a number of active amplification elements to be used.

2. A method for operating a solid-state RF power amplifier (SSPA) at a satellite ground station, the SSPA having an input for receiving an input signal, an output for providing an output signal, and a plurality of active amplification elements, the method comprising:
   determining a number of the plurality of active amplification elements to be used;
   routing the input signal to the determined number of the plurality of active amplification elements; and combining individual output signals from the determined number of the plurality of active amplification elements to provide the output signal,
wherein the determining includes:
periodically measuring a temperature at the SSPA;
comparing the measured temperature against a predetermined value; and
reducing the determined number of the plurality of active amplification elements to be used in response to a measured temperature in excess of the predetermined value.

3. A method for operating a solid-state RF power amplifier (SSPA) at a satellite ground station, the SSPA having an input for receiving an input signal, an output for providing an output signal, and a plurality of active amplification elements, the method comprising:
determining a number of the plurality of active amplification elements to be used;
routing the input signal to the determined number of the plurality of active amplification elements; and
combining individual output signals from the determined number of the plurality of active amplification elements to provide the output signal,
wherein the determining includes:
periodically measuring a standing wave ratio on a transmission line coupled to the SSPA;
comparing the measured standing wave ratio against a predetermined value; and
reducing the determined number of the plurality of active amplification elements to be used in response to a measured standing wave ratio in excess of the predetermined value.

4. A solid-state RF power amplifier (SSPA) for use at a satellite ground station, the SSPA comprising:
an input for receiving an input signal;
an output for providing an output signal;
a plurality of active amplification elements;
determination circuitry configured to determine a number of the plurality of active amplification elements to be used;
routing circuitry configured to route the input signal to the determined number of the plurality of active amplification elements; and
output circuitry configured to combine signals from the determined number of the plurality of active amplification elements into the output signal,
wherein the determination circuitry is configured to:
receive at the ground station a transmitted beacon signal having a predetermined transmitted signal level from a satellite;
measure at the ground station a signal level of the received beacon signal; and
periodically calculate a difference between the predetermined transmitted signal level and the measured signal level, and based upon the calculation determine a number of active amplification elements to be used.

5. A solid-state RF power amplifier (SSPA) for use at a satellite ground station, the SSPA comprising:
an input for receiving an input signal;
an output for providing an output signal;
a plurality of active amplification elements;
determination circuitry configured to determine a number of the plurality of active amplification elements to be used;
routing circuitry configured to route the input signal to the determined number of the plurality of active amplification elements; and
output circuitry configured to combine signals from the determined number of the plurality of active amplification elements into the output signal,
wherein the determination circuitry is configured to:
periodically measure a temperature at the SSPA;
compare the measured temperature against a predetermined value; and
reduce the determined number of the plurality of active amplification elements to be used in response to a measured temperature in excess of the predetermined value.

6. A solid-state RF power amplifier (SSPA) for use at a satellite ground station, the SSPA comprising:
an input for receiving an input signal;
an output for providing an output signal;
a plurality of active amplification elements;
determination circuitry configured to determine a number of the plurality of active amplification elements to be used;
routing circuitry configured to route the input signal to the determined number of the plurality of active amplification elements; and
output circuitry configured to combine signals from the determined number of the plurality of active amplification elements into the output signal,
wherein the determination circuitry is configured to:
periodically measure a standing wave ratio on a transmission line coupled to the SSPA;
compare a measured standing wave ratio against a predetermined value; and
reducing the determined number of the plurality of active amplification elements to be used in response to a measured standing wave ratio in excess of the predetermined value.

7. A method for operating a solid-state RF power amplifier (SSPA) at a satellite ground station, the SSPA having an input for receiving an input signal, an output for providing an output signal, and at least one active amplification element powered by a power supply providing a drain bias voltage Vds, the method comprising:
determining a Vds to be used;
providing Vds to the at least one active amplification element; and
directing the output signal from the at least one active amplification element to the output,
wherein the determining includes:
receiving at the ground station a transmitted beacon signal having a predetermined transmitted signal level from a satellite;
measuring at the ground station a signal level of the received beacon signal; and
periodically calculating a difference between the predetermined transmitted signal level and the measured signal level, and based upon the calculation determining the Vds to be used.

8. A method for operating a solid-state RF power amplifier (SSPA) at a satellite ground station, the SSPA having an input for receiving an input signal, an output for providing an output signal, and at least one active amplification element powered by a power supply providing a drain bias voltage Vds, the method comprising:
determining a Vds to be used;
providing Vds to the at least one active amplification element; and directing the output signal from the at least one active amplification element to the output, wherein the determining includes:

periodically measuring a temperature at the SSPA;

comparing the measured temperature against a predetermined value; and reducing the Vds to be used in response to a measured temperature in excess of the predetermined value.

9. A method for operating a solid-state RF power amplifier (SSPA) at a satellite ground station, the SSPA having an input for receiving an input signal, an output for providing an output signal, and at least one active amplification element powered by a power supply providing a drain bias voltage Vds, the method comprising:

determining a Vds to be used;

providing Vds to the at least one active amplification element; and directing the output signal from the at least one active amplification element to the output, wherein the determining includes:

periodically measuring a standing wave ratio on a transmission line coupled to the SSPA;

comparing the measured standing wave ratio against a predetermined value; and reducing the Vds to be used in response to a measured standing wave ratio in excess of the predetermined value.

10. The method of claim 7, wherein the at least one amplification element comprises a plurality of amplification elements.

11. The method of claim 7, wherein the at least one amplification element comprises a GaN FET.

12. The method of claim 11, wherein the at least one amplification element comprises a plurality of amplification elements.

13. A solid-state RF power amplifier (SSPA) for use at a satellite ground station, the SSPA comprising:

an input for receiving an input signal;

an output for providing an output signal;

at least one active amplification element powered by a power supply providing a drain bias voltage Vds;

determination circuitry configured to determine and set a Vds to be used;

routing circuitry configured to supply the input signal to the at least one active amplification element; and output circuitry configured to direct a signal from the at least one active amplification element into the output signal, wherein the determination circuitry is configured to:

receive at the ground station a transmitted beacon signal having a predetermined transmitted signal level from a satellite;

measure at the ground station a signal level of the received beacon signal; and periodically calculate a difference between the predetermined transmitted signal level and the measured signal level, and based upon the calculation determine the Vds to be used.

14. A solid-state RF power amplifier (SSPA) for use at a satellite ground station, the SSPA comprising:

an input for receiving an input signal;

an output for providing an output signal;

at least one active amplification element powered by a power supply providing a drain bias voltage Vds;

determination circuitry configured to determine and set a Vds to be used;

routing circuitry configured to supply the input signal to the at least one active amplification element; and output circuitry configured to direct a signal from the at least one active amplification element into the output signal, wherein the determination circuitry is configured to:

periodically measure a temperature at the SSPA;

compare the measured temperature against a predetermined value; and reduce the Vds to be used in response to a measured temperature in excess of the predetermined value.

15. A solid-state RF power amplifier (SSPA) for use at a satellite ground station, the SSPA comprising:

an input for receiving an input signal;

an output for providing an output signal;

at least one active amplification element powered by a power supply providing a drain bias voltage Vds;

determination circuitry configured to determine and set a Vds to be used;

routing circuitry configured to supply the input signal to the at least one active amplification element; and output circuitry configured to direct a signal from the at least one active amplification element into the output signal, wherein the determination circuitry is configured to:

periodically measure a standing wave ratio on a transmission line coupled to the SSPA;

compare a measured standing wave ratio against a predetermined value; and reduce the Vds to be used in response to a measured standing wave ratio in excess of the predetermined value.

16. The amplifier of claim 13, wherein the at least one amplification element comprises a plurality of amplification elements.

17. The amplifier of claim 13, wherein the at least one amplification element comprises a GaN FET.

18. The amplifier of claim 17, wherein the at least one amplification element comprises a plurality of amplification elements.

* * * * *